United States Patent
Bosquet et al.

(10) Patent No.: US 8,544,756 B2
(45) Date of Patent: Oct. 1, 2013

(54) METHOD OF RECEIVING A MODULE IN A SMART CARD BODY

(75) Inventors: Olivier Bosquet, Levallois Perret (FR); Mourad Laknin, Levallois Perret (FR); Denis Vere, Levallois Perret (FR)

(73) Assignee: Oberthur Technologies, Levallois Perret (FR)

( * ) Notice: Subject to any disclaimer, the term of this patent is extended or adjusted under 35 U.S.C. 154(b) by 0 days.

(21) Appl. No.: 13/310,967

(22) Filed: Dec. 5, 2011

(65) Prior Publication Data
US 2012/0138691 A1    Jun. 7, 2012

(30) Foreign Application Priority Data
Dec. 6, 2010 (FR) ...................................... 10 60112

(51) Int. Cl.
*G06K 19/06* (2006.01)
*G06K 7/08* (2006.01)

(52) U.S. Cl.
USPC ............ 235/492; 235/380; 235/451; 235/488

(58) Field of Classification Search
USPC ................. 235/380, 451, 488, 492, 375, 487
See application file for complete search history.

(56) References Cited

U.S. PATENT DOCUMENTS

| | | | | |
|---|---|---|---|---|
| 5,856,662 A | * | 1/1999 | Kohama et al. | 235/492 |
| 6,223,989 B1 | * | 5/2001 | Permingeat | 235/487 |
| 6,390,375 B2 | * | 5/2002 | Kayanakis | 235/492 |
| 6,986,467 B2 | * | 1/2006 | Takahashi et al. | 235/492 |
| 7,243,840 B2 | * | 7/2007 | Bason et al. | 235/380 |
| 7,905,415 B2 | * | 3/2011 | Basson et al. | 235/487 |
| 2001/0002035 A1 | * | 5/2001 | Kayanakis | 235/492 |
| 2006/0290343 A1 | * | 12/2006 | Crafts et al. | 324/158.1 |
| 2007/0200217 A1 | * | 8/2007 | Tsukahara et al. | 257/690 |
| 2009/0093136 A1 | * | 4/2009 | Hiew et al. | 439/55 |
| 2010/0002035 A1 | * | 1/2010 | Sheahan et al. | 347/10 |
| 2011/0011939 A1 | * | 1/2011 | Seah | 235/492 |

FOREIGN PATENT DOCUMENTS

| | | |
|---|---|---|
| EP | 0 197 847 A1 | 10/1986 |
| EP | 2 133 828 A2 | 12/2009 |
| WO | WO 2010/112761 A1 | 10/2010 |

OTHER PUBLICATIONS

Foreign Search Report dated Oct. 28, 2011.

* cited by examiner

*Primary Examiner* — Tuyen K Vo
(74) *Attorney, Agent, or Firm* — Arent Fox LLP

(57) ABSTRACT

The smart card comprises a module having a microcircuit and a body including a cavity for receiving the module, wherein the cavity defines at least one surface area for fastening the module in the cavity, the body being formed by a stack of at least first and second layers respectively presenting weak adhesion and strong adhesion with the module. The area extends in the weak adhesion layer and includes at least one hole leading to the strong adhesion layer so as to form an anchor point for the module directly with said layer.

17 Claims, 4 Drawing Sheets

METHOD OF RECEIVING A MODULE IN A SMART CARD BODY

CROSS-REFERENCE TO RELATED APPLICATION

This Application claims priority to French Patent Application No.: 1060112, filed Dec. 6, 2010, the disclosure of which is hereby incorporated in its entirety by reference.

FIELD OF THE INVENTION

The present invention relates to the technical field of smart cards, also commonly known as integrated circuit (IC) cards.

The invention applies more particularly, but not necessarily, to the field of so-called "dual interface" smart cards that have two interfaces: a first interface using external electrical contacts for establishing communication "with contact"; and a second interface using a near-field communication magnetic antenna, e.g. formed by a winding of a plurality of electrically-conductive turns, incorporated in the card in order to establish "contactless" communication.

BACKGROUND OF THE INVENTION

In general, the body of a smart card is made of plastics material. By way of example, the card body is formed by a stack of sheets of plastics material that are laminated together. The stack of layers comprises in particular a central layer, also known as an "inlay" layer, e.g. having the particular function of supporting the antenna.

Once the card body has been laminated, a cavity is machined in the body in order to form a housing for the microcircuit module. The cavity is defined by an inside surface presenting at least one area for making contact with the module in order to secure the module in the cavity when the module is received in the body. By way of example, the module may be fastened inside the cavity by adhesive, in particular adhesive bonding with said contact area.

At present there is a constant need to provide cards with new functions. It is thus known to add components to the card in addition to the antenna and the microcircuit module.

For example, it is known to add a light-emitting diode (LED) that is electrically connected to the antenna and that is suitable for lighting up to indicate that contactless communication is taking place properly.

The LED is generally formed by a component mounted on the surface of the support-forming inlay layer. Generally, this type of component is soldered onto its support by providing a mass of solder and then melting said mass in a "reflow" oven. The reflow technique serves to raise the solder to its melting point and thereby fasten the component. The reflow temperature is about 200° C.-230° C. and depends in particular on the nature of the solder.

Thus, the inlay layer needs to be made of a material that is capable of withstanding the high temperatures of reflow ovens, in particular temperatures that are higher than 200° C. By way of example, a plastics material that is suitable for this application is polyethylene terephthalate (PET).

The drawback of such a material is that it presents weaker adhesion with the adhesive materials that are used for fastening the module than does polyvinylchloride (PVC), which is the material that is conventionally used for fabricating other layers of the body. This raises a problem in particular when the cavity is formed at least in part inside the inlay layer and when the module, on being fitted inside the cavity, needs to be fastened in part to said layer.

Thus, when performing bending or twisting strength tests on a card, it is found that the module begins to separate after about one thousand cycles have been applied. This has the effect that a considerable number of smart cards need to be rejected because they present functional defects.

OBJECT AND SUMMARY OF THE INVENTION

A particular object of the invention is to propose a smart card that enables additional components to be incorporated with increased reliability and strength.

To this end, the invention provides a smart card comprising a module having a microcircuit and a body including a cavity for receiving the module, wherein the cavity defines at least one surface area for fastening the module in the cavity, the body being formed by a stack of at least first and second layers respectively presenting weak adhesion and strong adhesion with the module, and wherein the area extends in the weak adhesion layer and includes at least one hole leading to the strong adhesion layer so as to form an anchor point for the module directly with said layer.

In a preferred embodiment of the invention, the weak adhesion layer is an inlay forming a support for at least one electronic component.

Preferably, the electronic component is a surface-mounted component on the low adhesion layer. In a preferred embodiment, the component is assembled on its support using a reflow soldering technique.

In a preferred embodiment, the weak adhesion layer carries a near-field communications antenna.

Preferably, the cavity includes a bottom and a peripheral wall having a step forming a bearing rim, and the fastening area extends over said bearing rim. Under such circumstances, the hole leads to the strong adhesion layer and passes through the low adhesion layer. The module is then fitted, e.g. by bonding directly with the strong adhesion layer, either by providing a mass of adhesive that is suitable for flowing into the hole, or else by causing the material of the strong adhesion layer to creep into the inside of the hole so as to reach the surface of the fastening area.

In a preferred embodiment, the bottom of the cavity extends in the strong adhesion layer. This makes it possible, advantageously, to increase the bonding area between the module and the strong adhesion layer. The module is connected firstly to the fastening area that extends inside the low adhesion layer, and secondly to the bottom of the cavity that extends directly inside the strong adhesion layer.

In a preferred embodiment, the inlay layer is made essentially of a material having a high melting temperature. This enables it to withstand high temperatures, e.g. in reflow ovens.

The card of the invention may also include one or more of the following characteristics:
  the body includes at least two strong adhesion layers having the weak adhesion layer interposed therebetween; and
  the module is adhesively bonded on the fastening area.

The invention also provides a method of fabricating a card of the invention, wherein the card is formed by laminating together at least two layers, and wherein prior to lamination, at least one hole is formed through the weak adhesion layer in a location defining the fastening area, and during lamination, the material of the strong adhesion layer is allowed to creep through the hole.

Finally, the invention provides a method of fabricating a card of the invention, wherein the card is formed by laminating together at least two layers, and wherein the cavity is formed in the body and the hole is formed in the fastening area once the cavity has been formed.

BRIEF DESCRIPTION OF THE DRAWINGS

Other characteristics and advantages of the invention appear in the light of the following description made with reference to the accompanying drawings, in which.

MORE DETAILED DESCRIPTION

Figure 1:
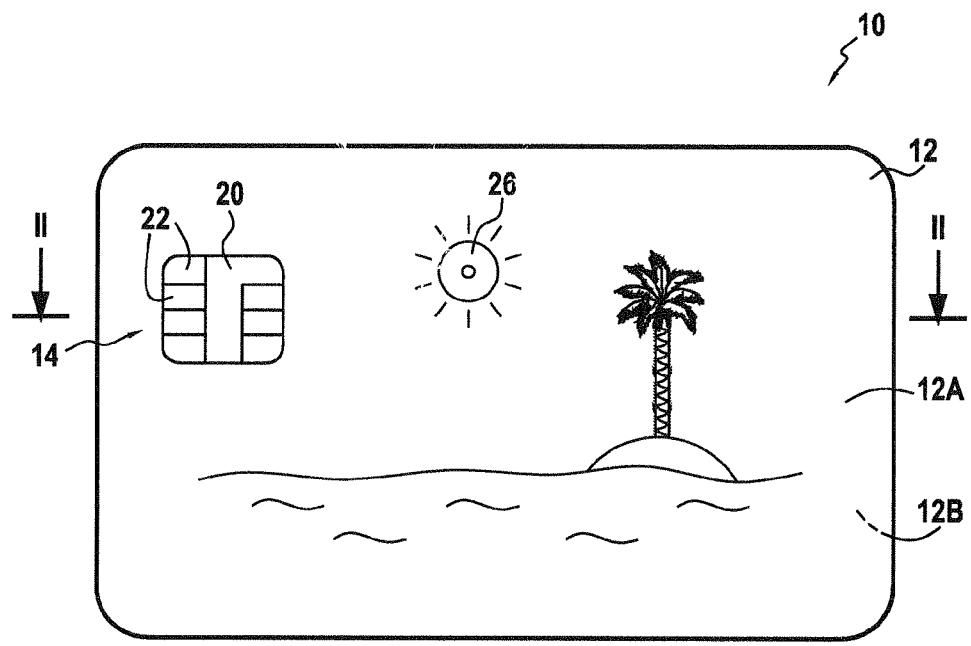
FIG. 1 shows a smart card in a first embodiment of the invention.

FIG. 1 shows a smart card. This smart card is given overall reference 10.

The card 10 generally comprises a body 12 defining the outside dimensions of the card 10. The body 12 defines opposite faces 12A and 12B. The body 12 defines outside dimensions for the card 10 complying with the format defined by the ISO 7816 standard for smart cards.

By way of example, the body 12 is essentially made of plastics material. The body 12 is preferably formed by laminating a stack of layers.

The card 10 also includes a module 14 having a microcircuit 16.

The module 14 preferably comprises a support 18 defining first and second opposite faces 18A and 18B, one of the faces, 18A, carrying the microcircuit 16, and the other face, 18B, carrying an interface 20 with external contacts 22 for occupying one of the faces of the card 10, e.g. the face 12A, as shown in FIG. 1.

By way of example, the support 18 is made of a material that essentially comprises epoxy, e.g. having a thickness of less than 200 micrometers (μm) and preferably lying in the range 70 μm to 100 μm.

Figure 2:
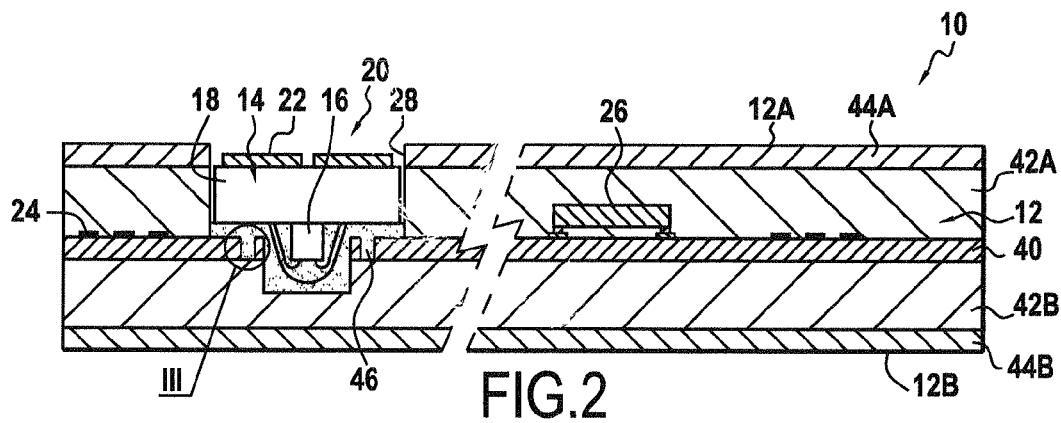
FIG. 2 is a section view of the card on line II-II of FIG. 1.

The microcircuit 14 is preferably mounted on the support 18 of the module 14 by a wiring method that is commonly referred to as "wire bonding", which method consists in adhesively bonding the microcircuit 16 to the support 18 via its passive surface, and wiring the microcircuit 16 from its active surface for electrical connection purposes. Under such circumstances, the microcircuit 16 and the cables are encapsulated, e.g. in a plug of polymer resin, as shown in FIG. 2.

In a variant that is not shown in the figures, the microcircuit 16 may be assembled by the so-called "flip-chip" method in the microcircuit module 16. This assembly method is characterized by a direct electrical connection between the active face of the microcircuit 16 and the support 18 for the purpose of making electrical connections with the appropriate conductors on the support 18.

In the example described, the card 10 is of the dual type, i.e. it is capable not only of establishing communication of the contact type via the interface 20 having external contacts 22, but also communication of the contactless type of the near-field contactless type.

To this end, in order to make near-field transmission of information possible, the card 10 also includes an antenna 24 that is incorporated in the support 18. By way of example, the antenna 24 is formed by a winding of turns extending along the periphery of the body 12 of the card 10. For example, the antenna 24 is also provided with at least two ends that are electrically connected to the microcircuit 16. For example, in order to connect the antenna 24 electrically to the microcircuit 16, the body 12 includes metal pads 36 arranged at each of the ends of the antenna 24 and suitable for establishing an electrical bridge between pins of the microcircuit 16 and the ends of the antenna 24 (where such pads are shown by way of example in FIG. 11).

In addition, in this second embodiment, the card 10 also includes an electronic component 26 of the surface-mounted type (SMC for "surface-mounted component"). In this example, the electronic component 26 is an LED.

By way of example, the LED 26 is powered via the antenna 24 that is incorporated in the thickness of the body 12. Thus, the diode 26 forms an indicator lamp suitable for lighting up when near field communication takes place. By way of example, this may serve to inform the user of the card that communication is taking place properly, or on the contrary that it has failed. By way of example, and as shown in FIG. 1, the LED 26 is incorporated in decoration printed on the card 10, for example in the center of a pattern representing the sun.

In accordance with the invention, the body 12 includes a cavity 28 for receiving the module 14, which cavity defines on its surface at least one area 30 for fastening the module 14 in the cavity 28. The cavity 28 is preferably dimensioned to receive the module 14 in full.

In this example, the cavity 28 has a bottom 32 and a peripheral wall 34 surrounding the bottom 32. The peripheral wall 34 also presents a step defining an internal rim 38 on which the support 18 of the module 14 bears. The fastening area 30 in the example described extends over the bearing rim 38.

In accordance with the invention, the body 12 is made up of at least one stack of two layers, a first layer 40 of weak adhesion with the module 14, and a second layer 42B of strong adhesion with the module 14. In the meaning of the invention, the terms "weak adhesion" and "strong adhesion" are used to mean that the material constituting the layer of weak adhesion presents surface energy that is lower than the layer with strong adhesion. Thus, with a given mass of adhesive, the module 14 adheres better to the layer 42B of strong adhesion than to the layer 40 of weak adhesion, e.g. when it is fitted by means of adhesive.

In this embodiment, the layer 40 of weak adhesion is a layer forming a support Lor the SMC 26. In known manner, the SMC 26 is fastened on a support 40 by a reflow soldering technique. This technique presents the advantage of enabling a large number of components to be fastened in a single operation. This technique is generally essential for enabling components to be soldered when the components have pins that are too small or inaccessible for soldering by means of a conventional soldering iron.

In this technique, the component 26 is placed on the support 40 with a mass of solder that generally has a melting temperature higher than 200° C. The assembly is then heated to this temperature in progressive manner in order to avoid subjecting the component 26 to thermal shocks, and it is maintained at a reflow temperature for a determined duration. At the end of this heating step, the assembly is cooled.

Preferably, the inlay layer 40 is adapted to withstand reflow temperatures that are greater than or equal to 200° C. For example, the material may essentially comprise a plastics material based on PET. This material presents weak adhesion properties, thereby making it difficult to bond the module directly on the face of the inlay layer 40.

Furthermore, and preferably, the layer of weak adhesion carries the antenna 24. For example, the antenna 24 is deposited on the surface of the weak adhesion layer.

In the example shown in FIG. 2, the body 12 comprises a stack of at least five layers, the inlay-forming central layer 40 being interposed between upper and lower compensation layers 42A and 42B, with that assembly being further interposed between two transparent protective layers 44A and 44B, referred to as "overlay" layers.

As shown in FIG. 2, the fastening area 30 extends at least in part over the weak adhesion layer 40. Thus, the fastening area 30 extends over the bearing rim 38. In addition, and preferably, the bottom cavity extends in the strong adhesion layer.

In accordance with the invention, this area 30 includes at least one hole 46 leading to the strong adhesion layer so as to form a point for anchoring the module 16 with said strong adhesion layer 42B.

In this embodiment, the fastening area 30 of the module 16 has a plurality of holes 46, e.g. four holes, that are regularly distributed on the bearing rim 38. In FIG. 2, only two of the holes 46 are shown.

The module 16 is preferably secured to the fastening area 30 by adhesive. In this first embodiment, the plurality of holes 46 is formed after the cavity has been made inside the weak adhesion layer 40. A mass of adhesive is placed between the module 16 and the fastening area 30 and it flows into each of the holes 46.

Figure 3:
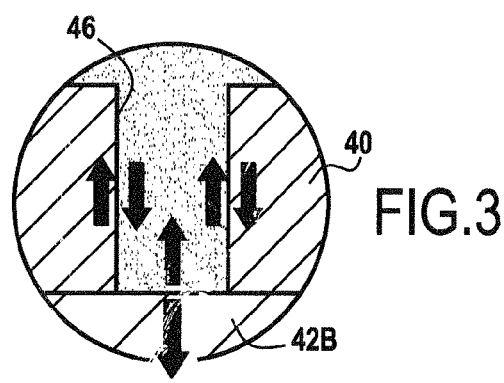
FIG. 3 is an enlarged view of a circled detail III in FIG. 2.

Thus, and as shown in detail in FIG. 3, the mass of adhesive fills the hollow volume of each open hole 46. The presence of a hole 46 presents the advantage of increasing the total contact area so as to obtain better adhesion between the module and the card. In addition, the adhesive mass produces shear forces against the vertical walls of the holes when the card is subjected to bending or twisting (forces that are represented diagrammatically by arrows in FIG. 3). Generally, adhesives are better at withstanding shear forces than traction forces. Furthermore, the increase in the bonding area associated with the presence of the holes makes it possible to reduce the magnitudes of the forces exerted per unit area.

Figure 4:
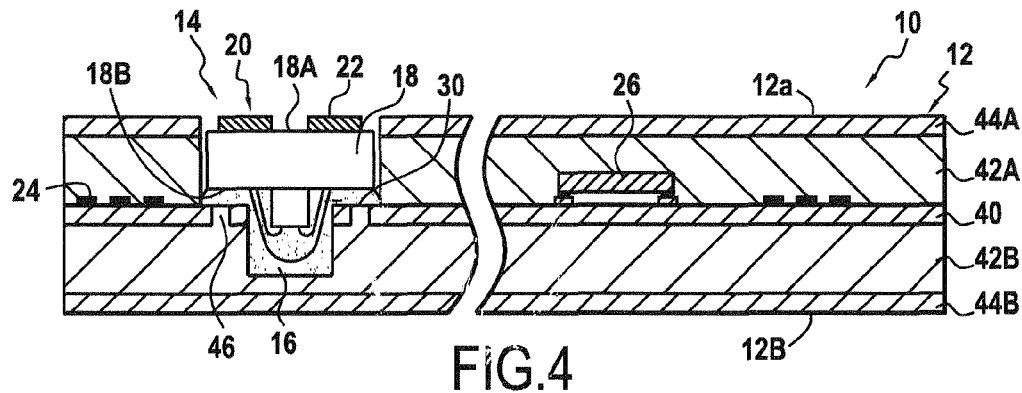
FIG. 4 shows a smart card in a second embodiment of the invention.

FIG. 4 is a section view through a card in a second embodiment of the invention. In FIG. 4, elements analogous to those of the above-described figures are referenced using identical references.

Unlike the first embodiment, in this second embodiment, the hole(s) 46 is/are filled with the material constituting the strong adhesion layer 42B. By way of example, the holes 46 are formed before the card body is laminated and they are filled by the material constituting the strong adhesion layer 42B creeping into the insides of the holes 46.

Thus, and preferably, the hole(s) 46 is/are filled by the material of the strong adhesion layer 46 and this material 46 lies flush with the surface of the fastening area 30. This presents the advantage of enabling the module 14 to be fastened directly to the material of the strong adhesion layer 42B.

There follows descriptions of the main steps of a method of fabricating a smart card in a first implementation, described with reference to FIGS. 5 to 7, and in a method of fabricating a smart card in a second implementation, described with reference to FIGS. 8 to 10.

Figure 5:
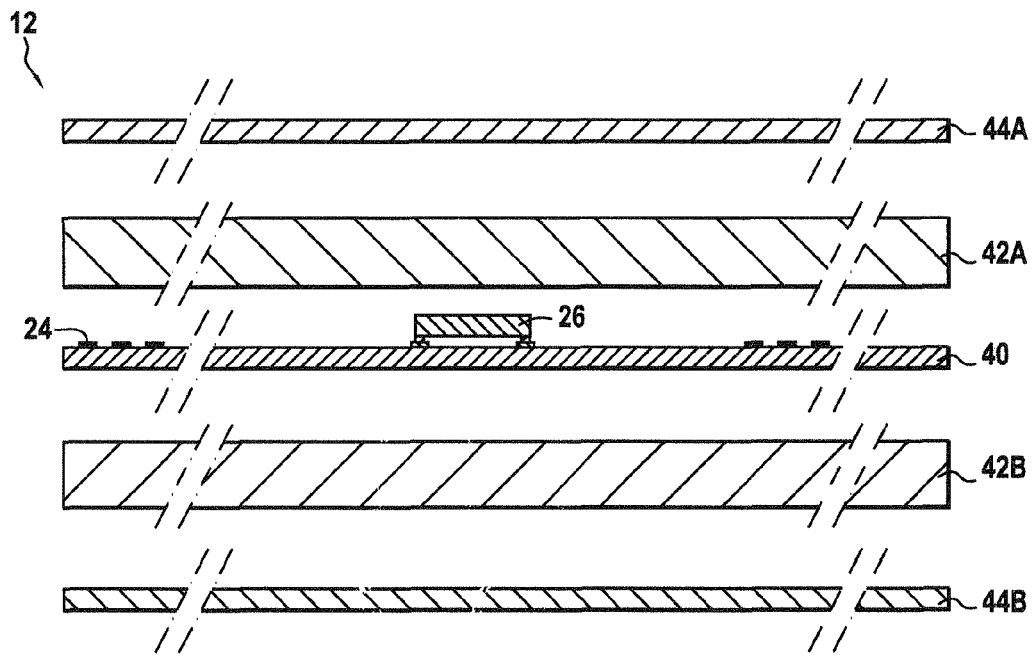
FIGS. 5 to 7 show fabrication steps for the card of FIG. 1.

In a first step shown in FIG. 5, five layers forming the body of the card 12 are stacked together: the inlay layer 40 is thus interposed between two compensation layers 42A and 42B, that are themselves interposed between two transparent overlay layers 44A, 44B. The inlay layer 40 constitutes a support for various components that are mounted on its surface, including the LED 26, and on one of its faces it carries the printed antenna 24 and a set of electrically-conductive pads for electrically connecting the antenna 24 with the module 14. By way of example, the antenna 24 is formed by photoetching a layer of copper. The stack of layers is then laminated, for example, so as to form the card body 12.

Figure 6:
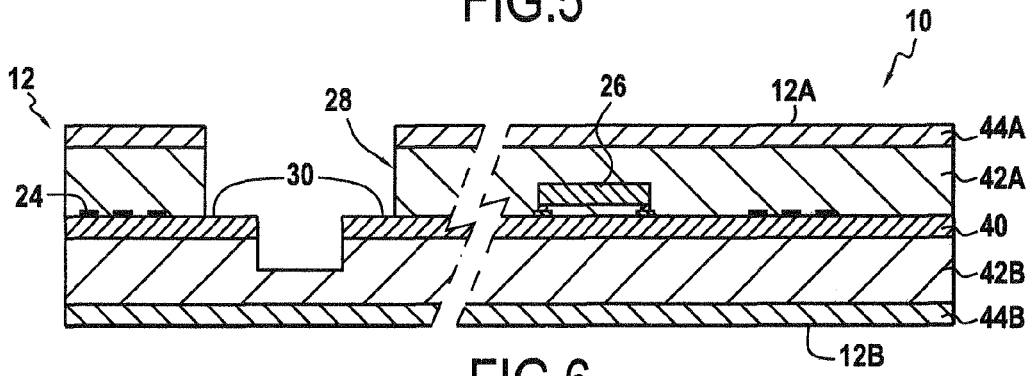
Figure 7:
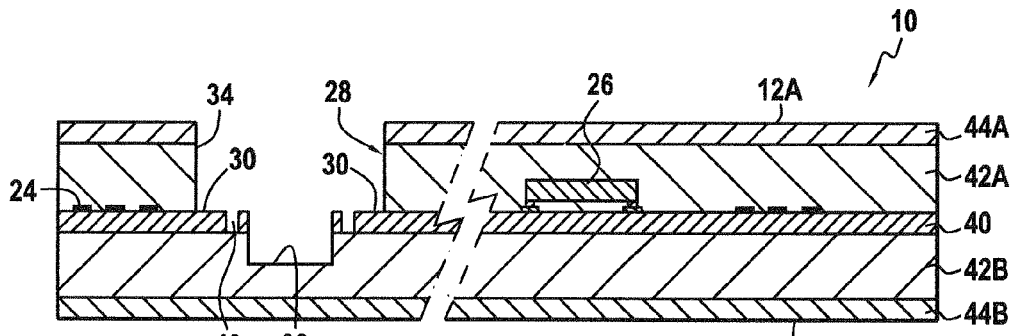

During a second step shown in FIG. 6, a cavity 28 is formed in the laminated body 12.

In the example described, such a cavity 28 is generally obtained for example by machining, typically by milling or by spot-facing in two operations:

a large spot-face for forming the peripheral zone corresponding to the depth of the step; and a small spot-face for forming the deeper central zone.

While the large spot-face is being formed, the electrically-conductive pads are partially laid bare, thus enabling them to be subsequently connected electrically with the module 14 and with the antenna.

Thereafter, the anchor holes 46 for the module 14 are formed in the body 12. By way of example, these holes 46 are formed beside the electrically-conductive pads 36. The cavity 28 is then filled with a mass of adhesive capable of flowing in particular into the insides of the holes 46.

In the second embodiment, the main steps of the method of fabricating the card are shown in FIGS. 8 to 11.

Figure 8:
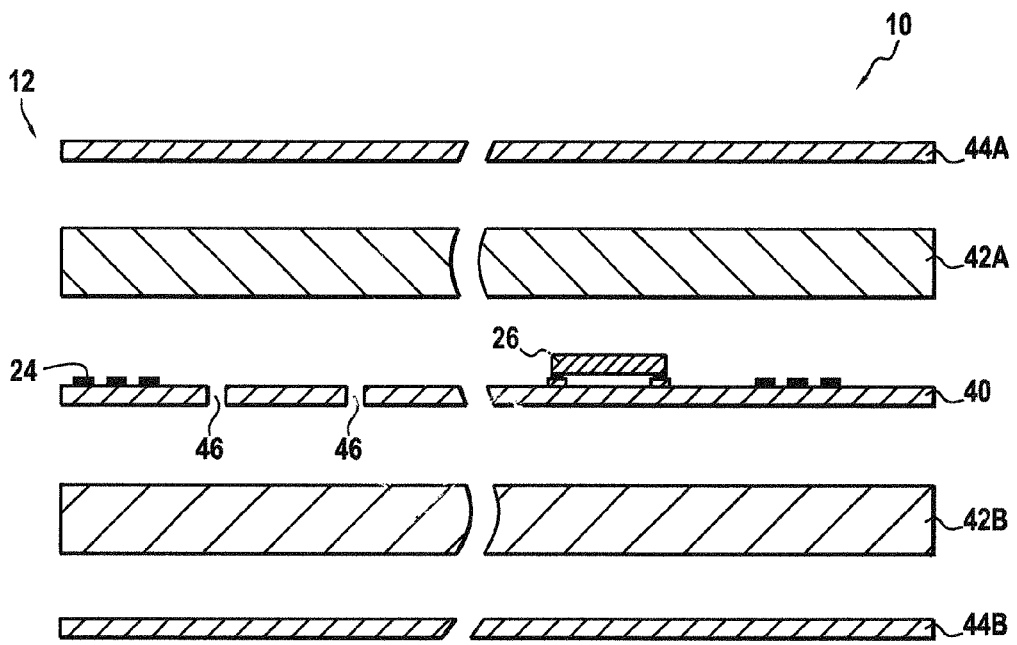

In this second embodiment, prior to lamination, at least one hole 46 is formed through the weak adhesion layer 40 in a location defining the area 30 (FIG. 8).

Figure 9:
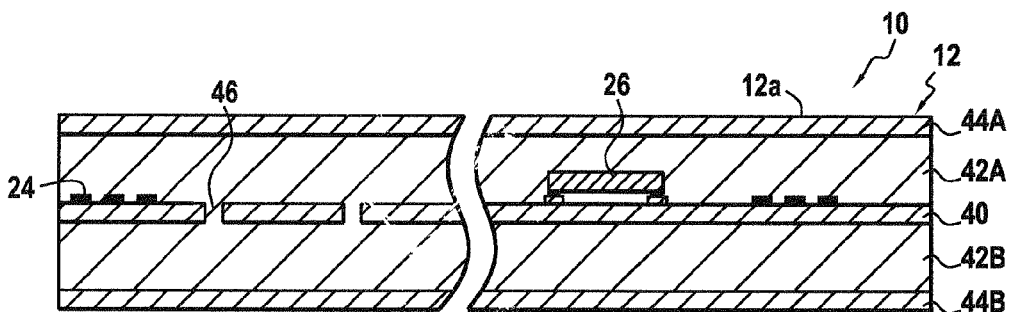
FIGS. 8 to 11 show the main fabrication steps for the card of FIG. 4.

Furthermore, during the lamination step, the material of the strong adhesion layer 42B is allowed to creep through each of the holes 46 (FIG. 9).

Figure 10:
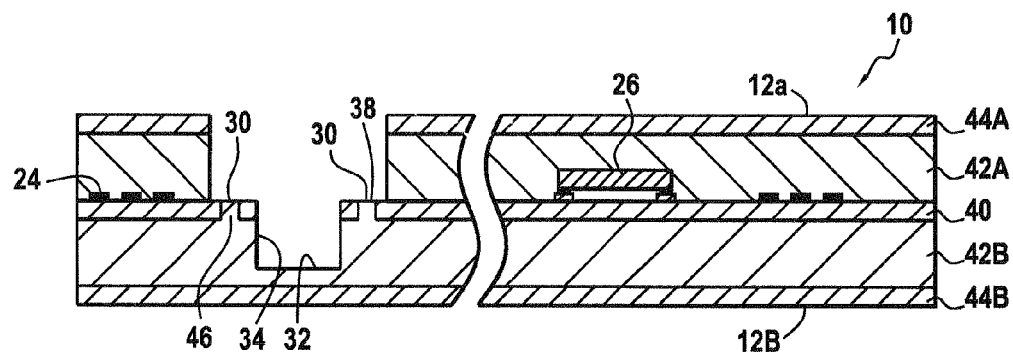
Figure 11:
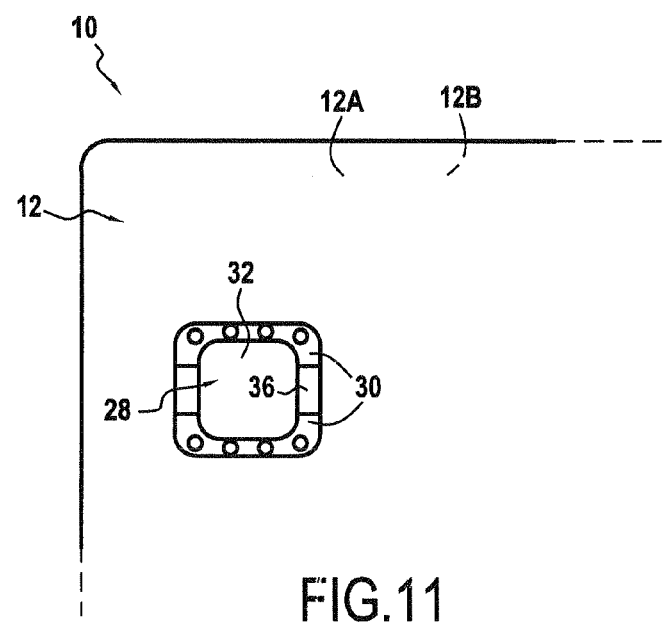

Thereafter, during a third step as shown in FIG. 10, the cavity is formed. During the machining of the cavity 28, the electrically-conductive pads 36 are laid bare, as are the holes 46 filled with the strong adhesion layer. As can be seen in FIG. 11, the fastening layer 30 for fastening the module 14 to the card 10 includes at least six anchor holes 46.

Naturally, the above-described embodiments do not present any limiting character and they may receive any desirable modification without thereby going beyond the ambit of the invention.

What is claimed is:

1. A smart card comprising:
   a module having a microcircuit, and
   a body including a cavity for receiving the module,
   wherein the cavity defines at least one surface area for fastening the module in the cavity, the body being formed by a stack of at least a first layer and a second layer, the second layer having a stronger adhesion with the module than the first layer, and
   wherein the surface area extends in the first layer and at least one hole is formed through the first layer from the surface area, the module being directly anchored with said second layer via said at least one hole.

2. A card according to claim 1, wherein the first layer is an inlay forming a support for at least one electronic component.

3. A card according to claim 2, wherein the electronic component is a surface-mounted component.

4. A card according to claim 1, wherein the first layer carries a near-field communications antenna.

5. A card according to claim 1, wherein the body includes at least two second layers each having stronger adhesion with the module than the first layer and having the first layer interposed therebetween.

6. A card according to claim 1, wherein the cavity includes a bottom and a peripheral wall having a step forming a bearing rim, and the surface area extends over said bearing rim, the at least one hole leading to the bearing rim.

7. A card according to claim 6, wherein the bottom of the cavity extends in the second layer.

8. A card according to claim 1, wherein the first layer is made essentially of a material having a higher melting temperature than the second layer.

9. A card according to claim 1, wherein the module is adhesively bonded on the surface area.

10. A method of fabricating a card according to claim 1,
wherein the card is formed by laminating together at least two layers, and
wherein prior to lamination, at least one hole is formed through the first layer in a location defining the surface area, and during lamination, the material of the second layer is allowed to creep through the hole.

11. A method of fabricating a card according to claim 1, wherein the body is formed by laminating together at least two layers, and wherein the cavity is then formed in the body and the hole is formed in the surface area after the cavity has been formed.

12. A method of fabricating a card according to claim 1, wherein, in a preliminary step, an electronic component is soldered onto the first layer by a reflow soldering technique.

13. A card according to claim 1, wherein the first layer comprises polyethylene terephthalate.

14. A card according to claim 1, wherein the second layer comprises polyvinylchloride.

15. A card according to claim 1, wherein the at least one surface area is configured to at least electrically contact the module with electrically conductive pads of the first layer, said first layer being an inlay forming a support for at least one electronic component.

16. A method of fabricating a smart card comprising:
soldering an electronic component onto a first layer by a reflow soldering technique;
forming a body as a stack of at least the first layer and a second layer having stronger adhesion with a module having a microcircuit than the first layer;
receiving the module in a cavity of the body; and
electrically contacting the module with electrically conductive pads of a surface area of the first layer, at least one hole being formed through the first layer from the surface area, the module being directly anchored with said second layer through said at least one hole.

17. A method according to claim 16, wherein the soldering is performed at a temperature higher than 200° C.

* * * * *